(12) United States Patent
Chen et al.

(10) Patent No.: US 10,283,359 B2
(45) Date of Patent: May 7, 2019

(54) SYSTEMS AND METHODS FOR GAP FILLING IMPROVEMENT

(71) Applicant: Taiwan Semiconductor Manufacturing Company Limited, Hsinchu (TW)

(72) Inventors: Chi-Yuan Chen, Hsinchu (TW); Li-Ting Wang, Hsinchu (TW); Teng-Chun Tsai, Hsinchu (TW); Chun-I Tsai, Hsinchu (TW); Wei-Jung Lin, Taipei (TW); Huang-Yi Huang, Hsinchu (TW); Cheng-Tung Lin, Hsinchu (TW); Hong-Mao Lee, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 15/488,652

(22) Filed: Apr. 17, 2017

(65) Prior Publication Data

US 2017/0221710 A1    Aug. 3, 2017

Related U.S. Application Data

(63) Continuation of application No. 14/108,819, filed on Dec. 17, 2013, now Pat. No. 9,624,576.

(51) Int. Cl.
*C23C 14/04* (2006.01)
*C23C 14/48* (2006.01)
(Continued)

(52) U.S. Cl.
CPC ...... *H01L 21/02694* (2013.01); *C23C 14/046* (2013.01); *C23C 14/48* (2013.01);
(Continued)

(58) Field of Classification Search
CPC ......... H01L 21/76883; H01L 21/32135; H01L 21/3215; H01L 21/32134; H01L 21/76859;
(Continued)

(56) References Cited

U.S. PATENT DOCUMENTS

5,869,359 A * 2/1999 Prabhakar ......... H01L 29/41733
257/E21.415
7,329,599 B1 * 2/2008 Wirbeleit .............. H01L 21/265
257/E21.199
(Continued)

*Primary Examiner* — Changhyun Yi
(74) *Attorney, Agent, or Firm* — Jones Day (57) ABSTRACT

Systems and methods are provided for contact formation. A semiconductor structure is provided. The semiconductor structure includes an opening formed by a bottom surface and one or more side surfaces. A first conductive material is formed on the bottom surface and the one or more side surfaces to partially fill the opening, the first conductive material including a top portion and a bottom portion. Ion implantation is formed on the first conductive material, the top portion of the first conductive material being associated with a first ion density, the bottom portion of the first conductive material being associated with a second ion density lower than the first ion density. At least part of the top portion of the first conductive material is removed. A second conductive material is formed to fill the opening.

20 Claims, 8 Drawing Sheets

(51) Int. Cl.
  *C23C 14/58*   (2006.01)
  *H01L 21/02*   (2006.01)
  *H01L 21/04*   (2006.01)
  *H01L 29/66*   (2006.01)
  *H01L 21/225*  (2006.01)
  *H01L 21/762*  (2006.01)
  *H01L 21/768*  (2006.01)
  *H01L 21/3115* (2006.01)
  *H01L 21/3213* (2006.01)
  *H01L 21/3215* (2006.01)

(52) U.S. Cl.
  CPC .... *C23C 14/5873* (2013.01); *H01L 21/02697* (2013.01); *H01L 21/046* (2013.01); *H01L 21/0415* (2013.01); *H01L 21/2253* (2013.01); *H01L 21/31155* (2013.01); *H01L 21/3215* (2013.01); *H01L 21/32134* (2013.01); *H01L 21/32135* (2013.01); *H01L 21/76224* (2013.01); *H01L 21/76254* (2013.01); *H01L 21/76859* (2013.01); *H01L 21/76876* (2013.01); *H01L 21/76877* (2013.01); *H01L 21/76879* (2013.01); *H01L 29/66734* (2013.01); *H01L 2224/05157* (2013.01); *H01L 2924/01002* (2013.01); *H01L 2924/01007* (2013.01); *H01L 2924/01009* (2013.01); *H01L 2924/01022* (2013.01); *H01L 2924/01074* (2013.01)

(58) Field of Classification Search
  CPC ......... H01L 21/76876; H01L 21/76879; H01L 21/76877; C23C 14/48; C23C 14/5873; C23C 14/046; C23C 16/045; C23C 16/505
  See application file for complete search history.

(56) References Cited

U.S. PATENT DOCUMENTS

| | | | |
|---|---|---|---|
| 2006/0019487 A1* | 1/2006 | Leuschner | G11C 11/16 438/637 |
| 2010/0285646 A1 | 11/2010 | Lin et al. | |
| 2012/0070982 A1* | 3/2012 | Yu | H01L 21/2855 438/653 |
| 2013/0001681 A1 | 1/2013 | Sin et al. | |
| 2014/0273436 A1* | 9/2014 | Hintze | H01L 21/76856 438/653 |
| 2015/0140233 A1* | 5/2015 | Zope | C23C 14/046 427/535 |

* cited by examiner

SYSTEMS AND METHODS FOR GAP FILLING IMPROVEMENT

CROSS REFERENCE TO RELATED APPLICATION

This is a continuing application of U.S. patent application Ser. No. 14/108,819 filed Dec. 17, 2013 entitled "SYSTEMS AND METHODS FOR GAP FILLING IMPROVEMENT," the entirety of which is incorporated herein by reference.

FIELD

The technology described in this disclosure relates generally to semiconductor devices and more particularly to semiconductor device fabrication.

BACKGROUND

With the rapid development of integrated circuit fabrication technology, more and more devices are incorporated on a single integrated circuit (IC) chip, and the size of each device on the IC chip and the spacing between the devices (i.e., feature size) continue to decrease. As feature sizes have become smaller, the demand for higher aspect ratios (i.e., a ratio between the depth and the width of a feature) has steadily increased. It is often difficult to deposit conductive materials into features (e.g., contact holes, via holes) with high aspect ratios to form contacts without generating certain undesirable defects (e.g., seams, voids).

SUMMARY

In accordance with the teachings described herein, systems and methods are provided for contact formation. A semiconductor structure is provided. The semiconductor structure includes an opening formed by a bottom surface and one or more side surfaces. A first conductive material is formed on the bottom surface and the one or more side surfaces to partially fill the opening, the first conductive material including a top portion and a bottom portion. Ion implantation is formed on the first conductive material, the top portion of the first conductive material being associated with a first ion density, the bottom portion of the first conductive material being associated with a second ion density smaller than the first ion density. At least part of the top portion of the first conductive material is removed. A second conductive material is formed to fill the opening.

In one embodiment, a method is provided for contact formation. A semiconductor structure is provided. The semiconductor structure includes an opening formed by a bottom surface and one or more side surfaces. A first conductive material is formed on the bottom surface and the one or more side surfaces to partially fill the opening, the first conductive material including a bottom portion and a top portion. Ion implantation is performed on the first conductive material. A second conductive material is formed on the first conductive material to fill the opening, a first formation rate of the second conductive material on the top portion of the first conductive material being smaller than a second formation rate of the second conductive material on the bottom portion of the first conductive material.

In another embodiment, a system includes: a deposition apparatus and an ion-implantation tool. The deposition apparatus is configured to form a first conductive material to partially fill an opening in a semiconductor structure. The first conductive material includes a top portion and a bottom portion. The ion-implantation tool is configured to perform ion implantation on the first conductive material. The top portion of the first conductive material is associated with a first ion density, and the bottom portion of the first conductive material is associated with a second ion density smaller than the first ion density. The deposition apparatus is further configured to form a second conductive material to fill the opening.

DETAILED DESCRIPTION

FIG. 1(a)-FIG. 1(e) depict example diagrams showing contact formation in a feature. The feature 102 corresponds to a gap or an opening (e.g., a contact hole, a via hole, a gate trench, etc.) with a high aspect ratio (i.e., a ratio between the depth and the width of the feature). A seam/void 104 is formed during the contact formation in the feature 102.

Figure 1A:
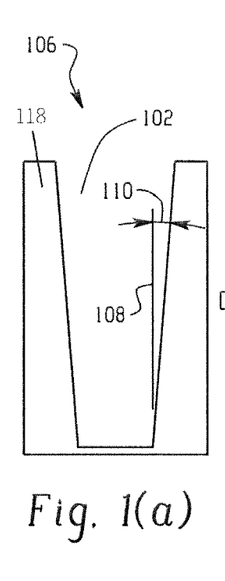
FIG. 1(a)-FIG. 1(e) depict example diagrams showing contact formation in a feature.
Figure 1B:
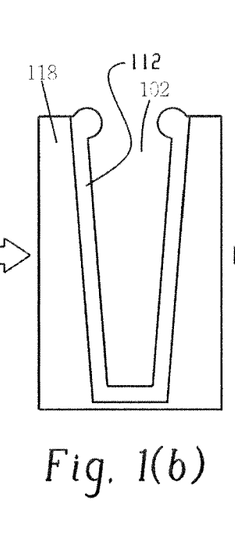

Specifically, as shown in FIG. 1(a), the feature 102 (e.g., a contact hole, a via hole, a gate trench, etc.) is formed (e.g., through dry etching or wet etching) in a semiconductor structure 106, and includes a bottom surface and one or more side surfaces. For example, relative to a vertical axis 108, one of the side surfaces is at a tilt angle 110. As shown in FIG. 1(b), one or more glue layers 112 (e.g., titanium and/or titanium nitride, etc.) are deposited in the feature 102 to partially fill the opening. A top portion of the glue layers 112 often has a larger thickness than a bottom portion of the glue layers 112. That is, the top portion of the glue layers 112 (e.g., the ball-shaped top portion) overhangs the bottom portion of the glue layers 112.

Figure 1C:
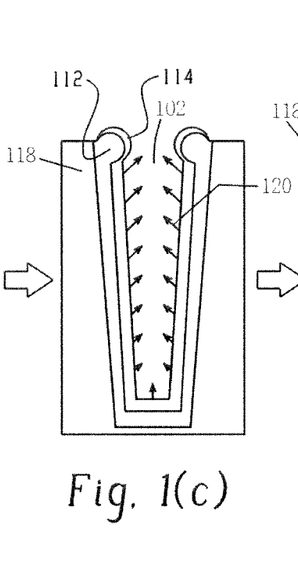
Figure 1D:
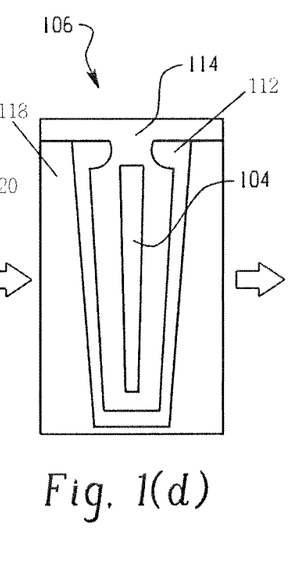
Figure 1E:
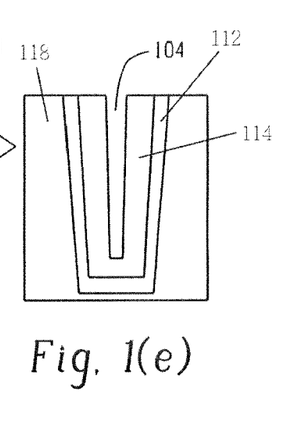
Figure 2A:
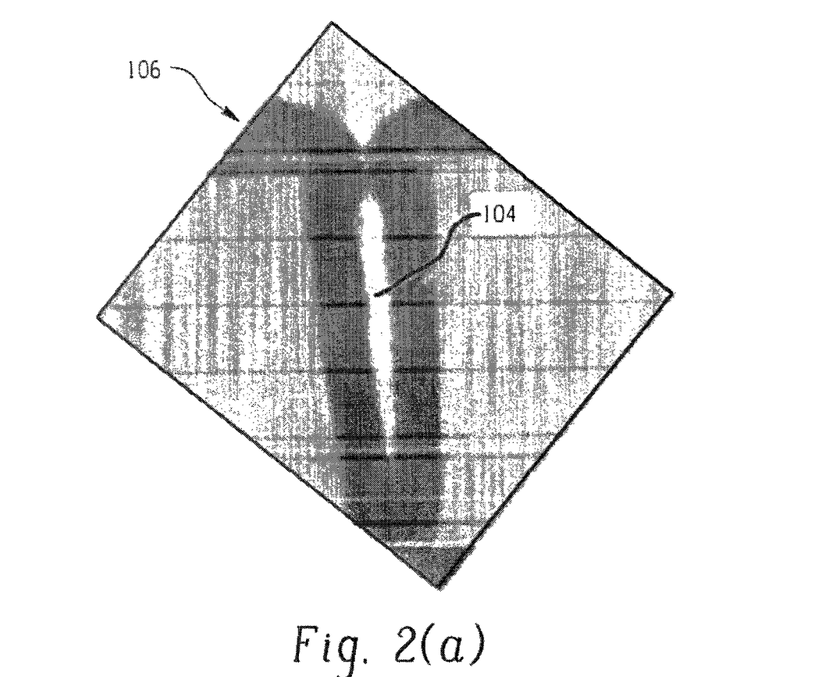
FIG. 2(a)-FIG. 2(b) depict example microscopic images showing seams/voids formed during contact formation in a feature.
Figure 2B:
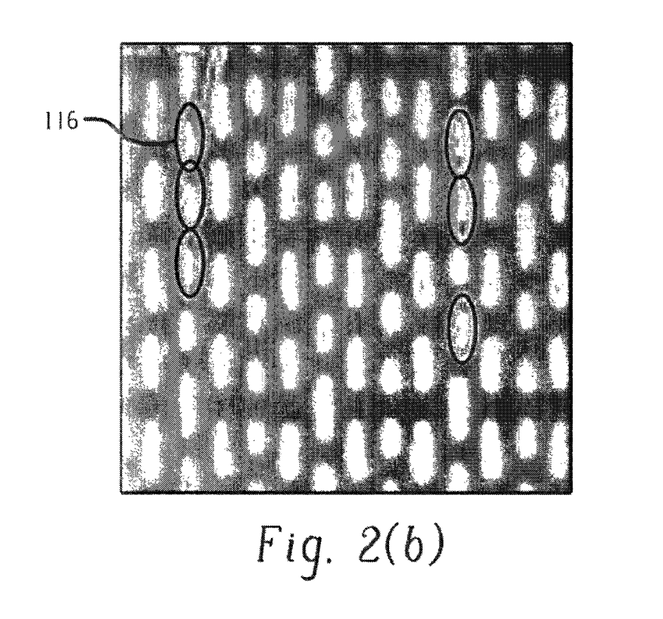

A conductive material 114 (e.g., tungsten, cobalt, aluminum, or other suitable conductive materials) is deposited on the glue layers 112 to further fill the opening, as shown in FIG. 1(c). For example, the conductive material 114 grows in conformation with the glue layers 112. Because the top portion of the glue layers 112 overhangs the bottom portion, the conductive material 114 grows to seal the opening at the top and thus the seam/void 104 is formed during the process, as shown in FIG. 1(d). FIG. 2(a) illustrates a microscopic image (e.g., a transmission-electron-microscopic image) of the seam/void 104 within the semiconductor structure 106. A chemical-mechanical polishing/planarization (CMP) process is carried out to remove part of the conductive material 114, and the seam/void 104 is exposed, as shown in FIG. 1(e). FIG. 2(b) illustrates another microscopic image of certain seams/voids exposed in the semiconductor structure 106. The seams/voids (e.g., dark dots) are shown in the circles 116. Such seams/voids often negatively affect the electrical properties of the formed contacts.

Figures 3A, 3B:
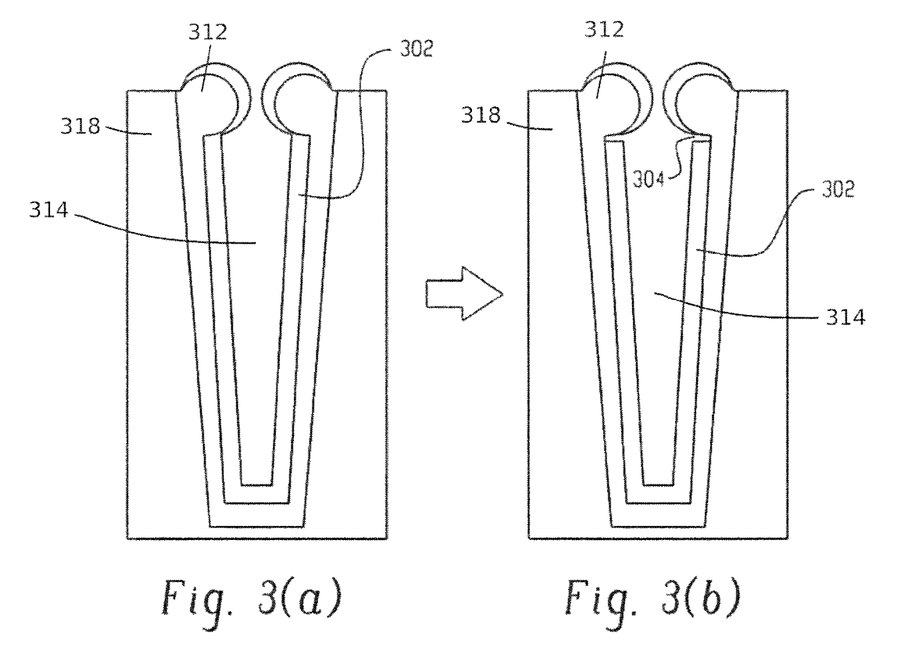
FIG. 3(a)-FIG. 3(c) depict example diagrams showing plasma treatment of conductive materials for contact formation.
Figure 4A:
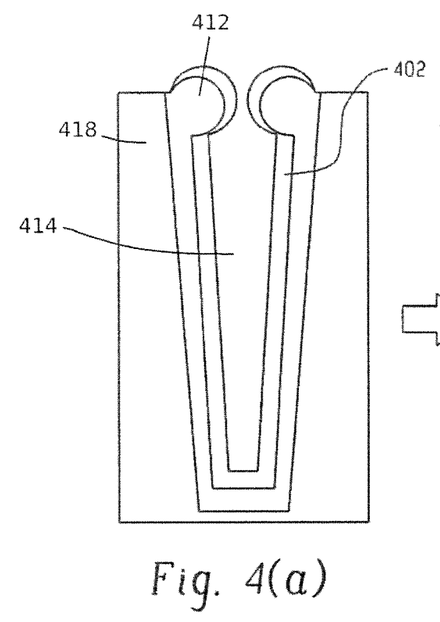
FIG. 4(a)-FIG. 4(c) depict example diagrams showing plasma etching of conductive materials for contact formation.
Figure 4B:
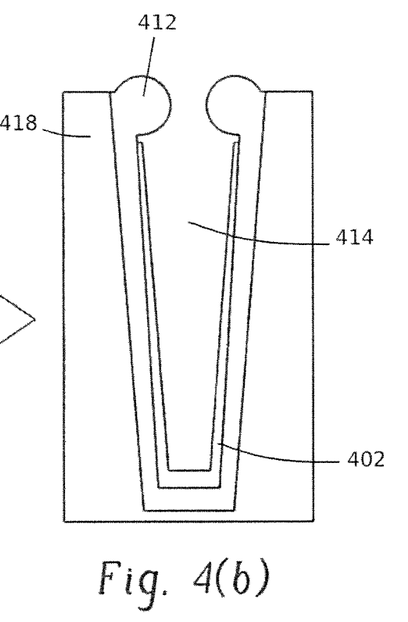

Plasma treatment or plasma etching may be used to ameliorate the above-noted seam/void problem. For example, a first conductive material (e.g., the conductive material 302 as shown in FIG. 3(a) or the conductive material 402 as shown FIG. 4(a)) is deposited in a feature (e.g., a contact hole, a via hole, a gate trench, etc.) to partially fill the opening of the feature. Then, plasma treatment (e.g., as shown in FIG. 3(b)) or plasma etching (e.g., as shown in FIG. 4(b)) is performed on the first conductive material before growing a second conductive material to further fill the opening.

Figure 3C:
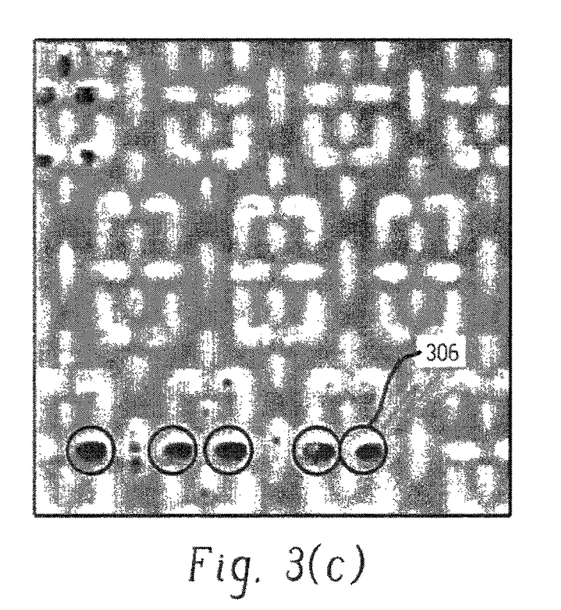
Figure 4C:
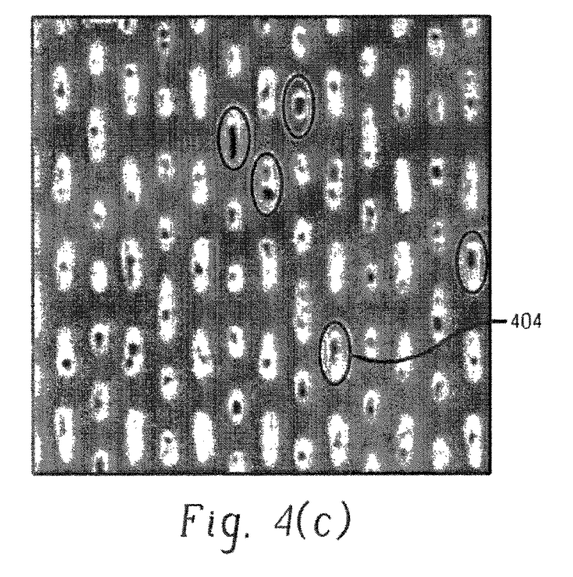

However, plasma treatment or plasma etching is often performed using chemical vapor deposition (CVD). It is usually difficult to precisely control the spatial distribution of the plasma and the processing extent, and oftentimes a wafer may be over-treated or over-etched. For example, as shown in FIG. 3(b), plasma over-treatment often results in a void 304 in the first conductive material 302. Furthermore, the physical/chemical properties of the over-treated first conductive material 302 may be changed significantly due to plasma over-treatment so that the second conductive material cannot be deposited properly on the first conductive material 302. FIG. 3(c) depicts an example microscopic image showing certain features after plasma over-treatment (e.g., in the circles 306). In another example, as shown in FIG. 4(b), plasma over-etching may remove too much of the first conductive material 402, and the remaining first conductive material 402 becomes too thin to grow the second conductive material properly. FIG. 4(c) depicts an example microscopic image showing certain features after plasma over-etching (e.g., in the circles 404).

Figure 5A:
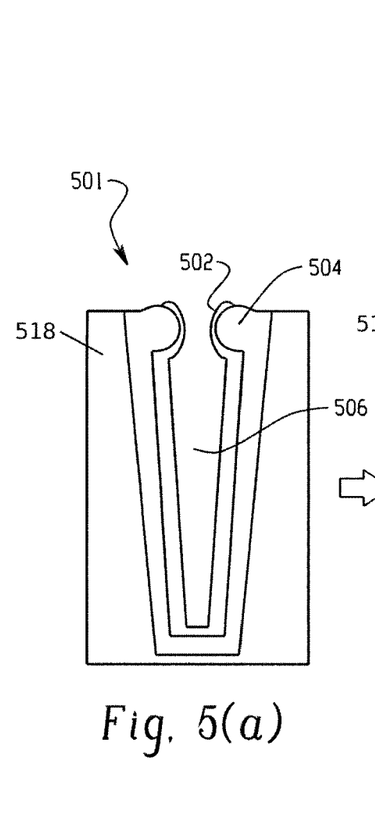
FIG. 5(a)-FIG. 5(d) depict example diagrams showing contact formation in a feature using ion implantation.

FIG. 5(a)-FIG. 5(d) depict example diagrams showing contact formation in a feature using ion implantation. As shown in FIG. 5(a), a semiconductor structure 501 including a feature 506 is provided for contact formation, and the feature 506 corresponds to a gap or an opening (e.g., a contact hole, a via hole, a gate trench, etc.). A first conductive material 502 (e.g., tungsten, cobalt, aluminum, or other suitable conductive materials) is formed on one or more glue layers 504 (e.g., titanium and/or titanium nitride, etc.) to partially fill the opening of the feature 506. For example, a top portion of the glue layers 504 overhangs a bottom portion of the glue layers 504. The first conductive material 502 grows in conformation with the glue layers 504, but a top portion of the first conductive material 502 does not converge to seal the opening.

Figure 5B:
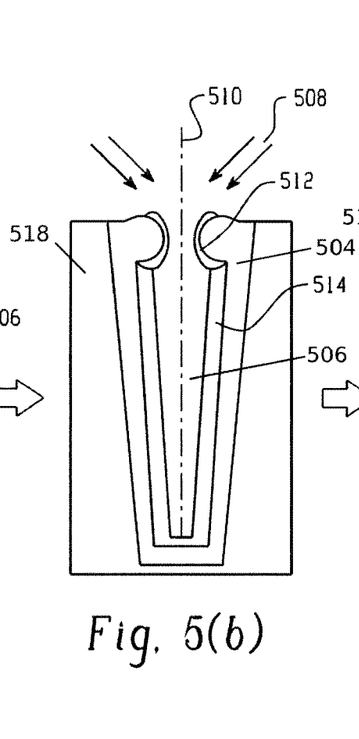

Ion implantation is performed to treat the first conductive material 502, as shown in FIG. 5(b). The conditions (e.g., incident angle, dose, energy) of the ion implantation depend at least in part on the dimensions (e.g., depth, width, tilt angle of side surfaces) of the feature 506. For example, the feature 506 has a depth of about 100 nm and a width of about 20 nm, and the thickness of the first conductive material is about 3 nm. The ion implantation implements fluoride ions (e.g., $F^+$) with a dose of about $10^{15}$ cm$^{-2}$. The energy associated with the ion implantation is about 10 keV, and an incident angle of the ion beams is about 45° relative to a vertical axis 510. More ions are implanted in a top portion 512 of the first conductive material 502 than a bottom portion 514 of the first conductive material 502. That is, the top portion 512 is associated with a higher ion density than the bottom portion 514. As a result, physical/chemical properties of the top portion 512 have been changed more than those of the bottom portion 514.

Figure 5C:
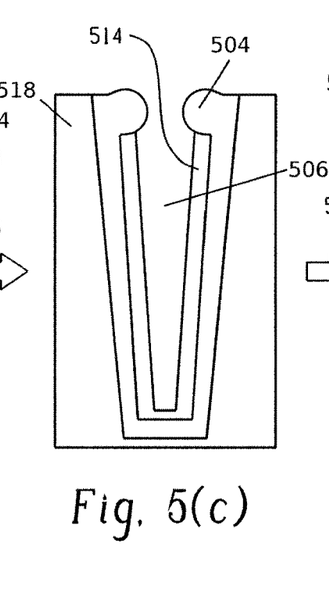
Figure 5D:
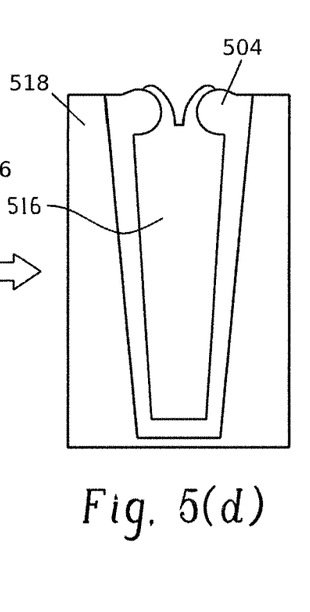

Etching (e.g., dry etching or wet etching) is subsequently performed, as shown in FIG. 5(c). Because of the ion implantation treatment, the etch rate of the top portion 512 is much larger than the etch rate of the bottom portion 514, and the top portion 512 is removed after the etching. For example, the etchant is selected to be $NF_3$. A second conductive material 516 (e.g., tungsten, cobalt, aluminum, or other suitable conductive materials) is formed to further fill the opening from bottom to top, as shown in FIG. 5(d). As an example, the semiconductor structure 501 includes a silicon substrate, a III-V substrate, a silicon-germanium substrate, a germanium substrate, or other suitable substrates.

Figure 6A:
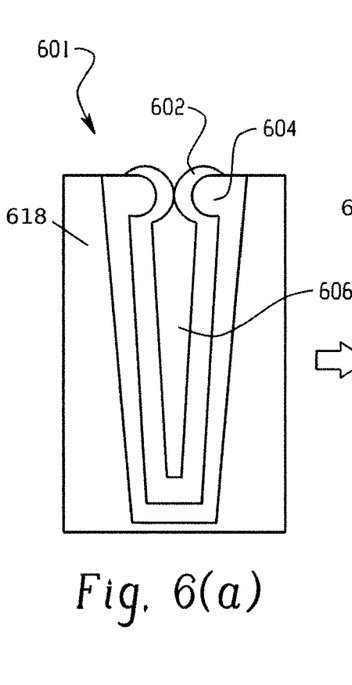
FIG. 6(a)-FIG. 6(d) depict other example diagrams showing contact formation in a feature using ion implantation.

FIG. 6(a)-FIG. 6(d) depict other example diagrams showing contact formation in a feature using ion implantation. As shown in FIG. 6(a), a semiconductor structure 601 including a feature 606 is provided for contact formation, and the feature 606 corresponds to a gap or an opening (e.g., a contact hole, a via hole, a gate trench, etc.). A first conductive material 602 (e.g., tungsten, cobalt, aluminum, or other suitable conductive materials) is formed on one or more glue layers 604 (e.g., titanium and/or titanium nitride, etc.) to partially fill the opening of the feature 606. For example, a top portion of the glue layers 604 overhangs a bottom portion of the glue layers 604. The first conductive material 602 grows in conformation with the glue layers 604, and a top portion of the first conductive material 602 converges to seal the opening.

Figure 6B:
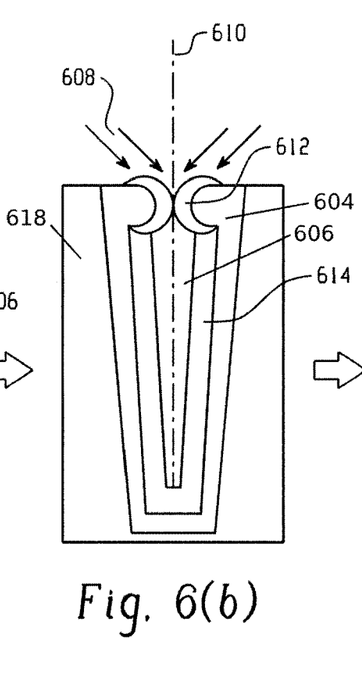

Ion implantation is performed to treat the first conductive material 602, as shown in FIG. 6(b). For example, the feature 606 has a depth of about 100 nm and a width of about 20 nm, and the thickness of the first conductive material is about 10 nm. The ion implantation implements fluoride ions (e.g., $F^+$) with a dose of about $10^{15}$ cm$^{-2}$. An incident angle of the ion beams is about 45° relative to a vertical axis 610. Because of the merging of the top portion 612 of the first conductive material 602, the energy of the ion implantation is selected to be about 20 keV to provide a larger implant depth. Most ions are implanted in a top portion 612 of the first conductive material 602, while a bottom portion 614 of the first conductive material 602 receives a small number of ions or no ions. That is, the top portion 612 is associated with a much higher ion density than the bottom portion 614. As a result, physical/chemical properties of the top portion 612 have been changed more than those of the bottom portion 614.

Figure 6C:
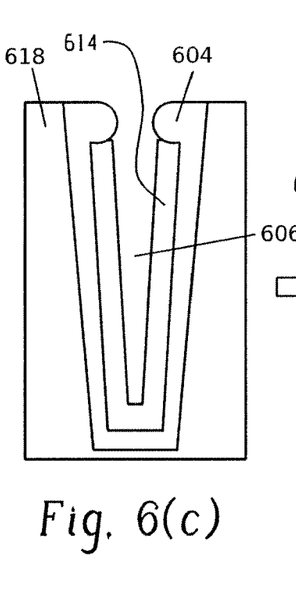
Figure 6D:
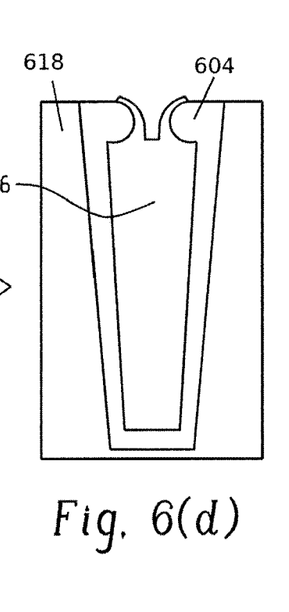

Etching (e.g., dry etching or wet etching) is performed, as shown in FIG. 6(c). Because of the ion implantation treatment, the top portion 612 is removed after the etching. For example, the etchant is selected to be $NF_3$. A second conductive material 616 (e.g., tungsten, cobalt, aluminum, or other suitable conductive materials) is formed to further fill the opening from bottom to top, as shown in FIG. 6(d).

Figure 7A:
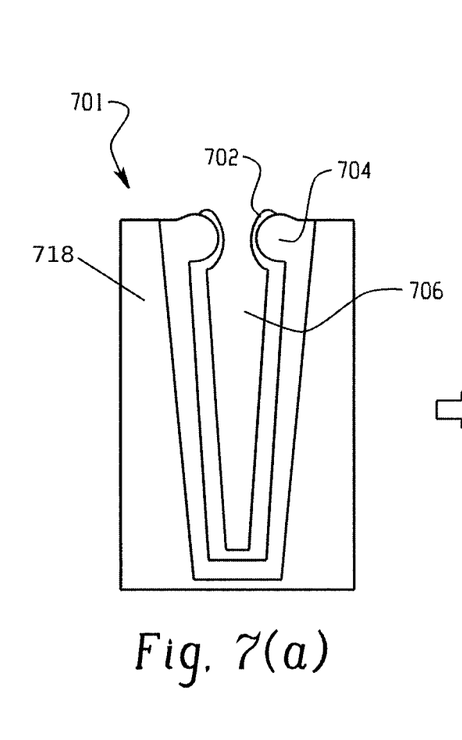
FIG. 7(a)-FIG. 7(c) depict example diagrams showing contact formation in a feature using ion implantation.
Figure 7B:
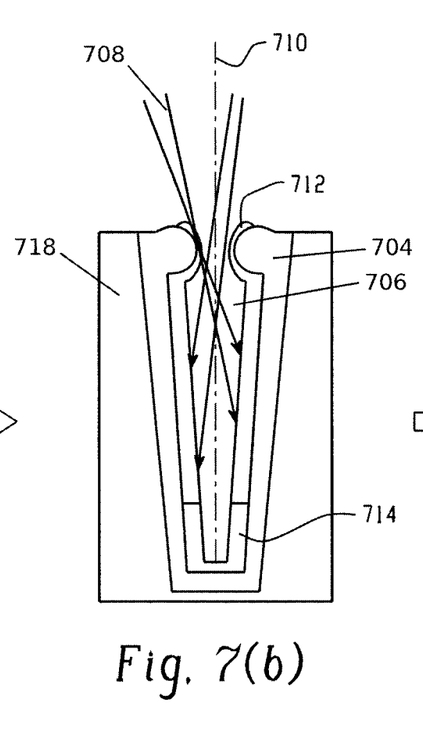
Figure 7C:
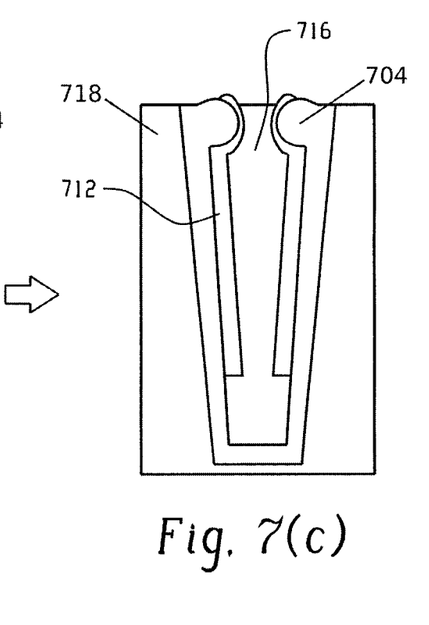

FIG. 7(a)-FIG. 7(c) depict example diagrams showing contact formation in a feature using ion implantation. As shown in FIG. 7(a), a semiconductor structure 701 including a feature 706 is provided for contact formation, and the feature 706 corresponds to a gap or an opening (e.g., a contact hole, a via hole, a gate trench, etc.). A first conductive material 702 (e.g., tungsten, cobalt, aluminum, or other suitable conductive materials) is formed on one or more glue layers 704 (e.g., titanium and/or titanium nitride, etc.) to partially fill the opening of the feature 706. For example, a top portion of the glue layers 704 overhangs a bottom portion of the glue layers 704. The first conductive material 702 grows in conformation with the glue layers 704, but a top portion of the first conductive material 702 does not converge to seal the opening.

Ion implantation is performed to treat the first conductive material 702, as shown in FIG. 7(*b*). For example, the feature 706 has a depth of about 100 nm and a width of about 20 nm, and the thickness of the first conductive material is about 3 nm. The ion implantation implements nitrogen ions (e.g., $N^+$), helium ions (e.g., $He^+$), or other suitable ions with a dose of about $10^{16}$ $cm^{-2}$. An incident angle of the ion beams is about 10° relative to a vertical axis 710. The energy of the ion implantation is selected to be about 10 keV. More ions are implanted in a top portion 712 of the first conductive material 702 than a bottom portion 714 of the first conductive material 702. That is, the top portion 712 is associated with a much higher ion density than the bottom portion 714. As a result, physical/chemical properties of the top portion 712 have been changed more than those of the bottom portion 714.

The deposition of a second conductive material 716 (e.g., tungsten, cobalt, aluminum, or other suitable conductive materials) begins to further fill the opening. Because of the ion implantation treatment, the formation rate of the second conductive material 716 on the top portion 712 is much lower than the formation rate of the second conductive material 716 on the bottom portion 714. Thus, the second conductive material 716 fills the opening from bottom to top, as shown in FIG. 7(*d*).

Figure 8:
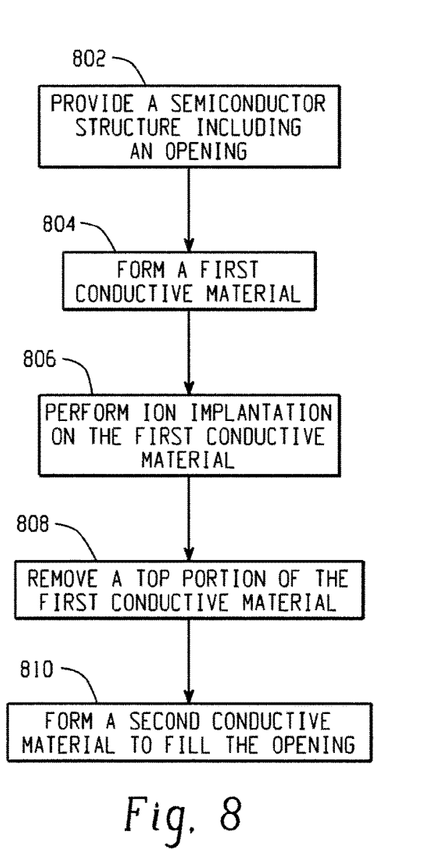
FIG. 8 depicts an example flow chart for contact formation in a feature using ion implantation.

FIG. 8 depicts an example flow chart for contact formation in a feature using ion implantation. At 802, a semiconductor structure is provided for contact formation. The semiconductor structure includes a feature corresponding to an opening formed by a bottom surface and one or more side surfaces. At 804, a first conductive material is formed on the bottom surface and the one or more side surfaces to partially fill the opening. The first conductive material includes a top portion and a bottom portion. At 806, ion implantation is performed on the first conductive material. The top portion of the first conductive material is associated with a first ion density, and the bottom portion of the first conductive material is associated with a second ion density smaller than the first ion density. At 808, at least part of the top portion of the first conductive material is removed (e.g., through dry etching or wet etching). At 810, a second conductive material is formed to fill the opening (e.g., from bottom to top).

Figure 9:
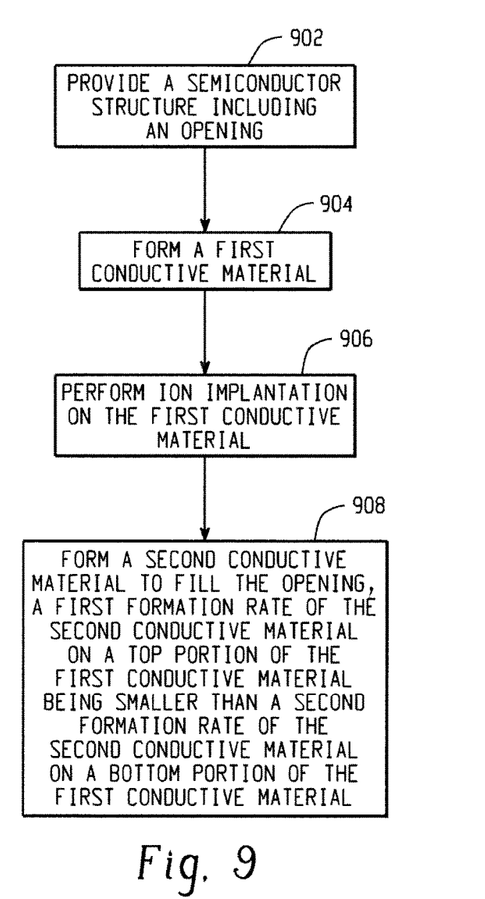
FIG. 9 depicts another example flow chart for contact formation in a feature using ion implantation.

FIG. 9 depicts another example flow chart for contact formation in a feature using ion implantation. At 902, a semiconductor structure is provided for contact formation. The semiconductor structure includes a feature corresponding to an opening formed by a bottom surface and one or more side surfaces. At 904, a first conductive material is formed on the bottom surface and the one or more side surfaces to partially fill the opening. The first conductive material includes a top portion and a bottom portion. At 906, ion implantation is performed on the first conductive material. At 908, a second conductive material is formed to fill the opening (e.g., from bottom to top). A first formation rate of the second conductive material on the top portion of the first conductive material is smaller than a second formation rate of the second conductive material on the bottom portion of the first conductive material.

This written description uses examples to disclose embodiments of the disclosure, include the best mode, and also to enable a person of ordinary skill in the art to make and use various embodiments of the disclosure. The patentable scope of the disclosure may include other examples that occur to those of ordinary skill in the art. One of ordinary skill in the relevant art will recognize that the various embodiments may be practiced without one or more of the specific details, or with other replacement and/or additional methods, materials, or components. Further, persons of ordinary skill in the art will recognize various equivalent combinations and substitutions for various components shown in the figures.

For example, a system can be implemented to perform contact formation in a feature using ion implantation. The system includes: a deposition apparatus and an ion-implantation tool. The deposition apparatus is configured to form a first conductive material to partially fill an opening in a semiconductor structure. The first conductive material includes a top portion and a bottom portion. The ion-implantation tool is configured to perform ion implantation on the first conductive material. The top portion of the first conductive material is associated with a first ion density, and the bottom portion of the first conductive material is associated with a second ion density smaller than the first ion density. The deposition apparatus is further configured to form a second conductive material to fill the opening. The system further includes an etching component configured to remove at least part of the top portion of the first conductive material before the formation of the second conductive material. In another exemplary aspect, a semiconductor structure comprises a recess in a semiconductor substrate defining sidewalls and a bottom; and a first conductive layer disposed along the sidewalls of the recess and defining a void, such that the first conductive layer has a first ion implantation density in a top portion distal from a bottom portion disposed proximate to the bottom of the recess, and the bottom portion has a second ion density; and a second conductive layer disposed within the void. In another exemplary aspect, a semiconductor structure comprises a substrate including a surface and a recess defining sidewalls and a bottom, where the sidewalls have a top portion proximate the surface and a bottom portion proximate the bottom; and a glue layer disposed along the sidewalls and bottom; and a first conductive layer disposed on the glue layer to define a void; and a second conductive layer disposed within the void; and a decreasing ion implantation density in the first conductive layer extending from the top portion having a greater ion density to the bottom portion having a lesser ion density. In yet another exemplary aspect, a semiconductor structure formed in a recess comprising a substrate comprising germanium and having a surface and a recess defining sidewalls and a bottom; a glue layer comprising titanium disposed along the sidewalls and the bottom; a first conductive layer comprising tungsten disposed on the glue layer and defining a void; and a second conductive layer comprising cobalt filling the void; where the first conductive layer includes ions implanted at a first density near the surface and a second ion density near the bottom, the first density greater than the second density.

Well-known structures, materials, or operations may not be shown or described in detail to avoid obscuring aspects of various embodiments of the disclosure. Various embodiments shown in the figures are illustrative example representations and are not necessarily drawn to scale. Particular features, structures, materials, or characteristics may be combined in any suitable manner in one or more embodiments. The present disclosure may repeat reference numerals and/or letters in the various examples, and this repetition is for the purpose of simplicity and clarity and does not in itself dictate a relationship between the various embodiments and/or configurations discussed. Various additional layers and/or structures may be included and/or described features may be omitted in other embodiments. For example, a particular layer described herein may include multiple components which are not necessarily connected physically or electrically. Various operations may be described as multiple discrete operations in turn, in a manner that is most helpful in understanding the disclosure. However, the order of description should not be construed as to imply that these operations are necessarily order dependent. In particular, these operations need not be performed in the order of presentation. Operations described herein may be performed in a different order, in series or in parallel, than the described embodiments. Various additional operations may be performed and/or described. Operations may be omitted in additional embodiments.

This written description and the following claims may include terms, such as on, in, etc. that are used for descriptive purposes only and are not to be construed as limiting. The embodiments of a device or article described herein can be manufactured, used, or shipped in a number of positions and orientations. For example, the term "on" as used herein (including in the claims) may not necessarily indicate that a first layer/structure "on" a second layer/structure is directly on or over and in immediate contact with the second layer/structure unless such is specifically stated; there may be one or more third layers/structures between the first layer/structure and the second layer/structure. The term "in" used herein (including in the claims) for a situation where a device/component is fabricated "in" a layer/structure does not indicate that all parts of the device/component are completely contained inside the layer/structure unless such is specifically stated; there may be one or more parts of the device/component exist outside of the layer/structure. The term "substrate" used herein (including in the claims) may refer to any construction comprising one or more semiconductive materials, including, but not limited to, bulk semiconductive materials such as a semiconductive wafer (either alone or in assemblies comprising other materials thereon), and semiconductive material layers (either alone or in assemblies comprising other materials). The term "semiconductor structure" used herein (including in the claims) may refer to shallow trench isolation features, poly-silicon gates, lightly doped drain regions, doped wells, contacts, vias, metal lines, or other types of circuit patterns or features to be formed on a semiconductor substrate. In addition, the term "semiconductor structure" used herein (including in the claims) may refer to various semiconductor devices, including transistors, capacitors, diodes, etc.

What is claimed is:

1. A semiconductor structure comprising:
   a first volume defined by one or more sidewalls formed in a semiconductor substrate;
   a first conductive layer disposed along the one or more sidewalls of the first volume and defining a second volume within the first volume, wherein the first conductive layer is a continuous material layer having a first ion density in a top portion distal from a bottom portion disposed proximate to the bottom of the first volume, the bottom portion having a second ion density, the first ion density greater than the second ion density; and
   a second conductive layer disposed within the second volume.

2. The semiconductor structure of claim 1, further comprising a glue layer between the sidewalls and the first conductive layer, the glue layer including titanium.

3. The semiconductor structure of claim 1, wherein the first ion density and the second ion density include helium ions.

4. The semiconductor structure of claim 1, wherein the first ion density and the second ion density include nitrogen ions.

5. The semiconductor structure of claim 1, wherein the first ion density and the second ion density include fluoride ions.

6. The semiconductor structure of claim 1, wherein the second conductive layer fills the second volume and the first conductive layer comprises cobalt and the second conducive layer comprises tungsten.

7. The semiconductor structure of claim 1, wherein the first volume is about 100 nm deep and about 20 nm wide and a thickness of the first conductive material is about 3 nm.

8. The semiconductor structure of claim 1, wherein the first volume has a depth to width ratio of about 5.

9. The semiconductor structure of claim 1, wherein a thickness of the first conductive layer is about 3 nm and a thickness of the second conductive layer is about 20 nm.

10. A semiconductor structure comprising:
    a substrate including a surface and a first volume defining sidewalls and a bottom, the sidewalls having a top portion proximate the surface and a bottom portion proximate the bottom;
    a glue layer disposed along the sidewalls and bottom;
    a first conductive layer disposed on the glue layer and defining a second volume, wherein the first conductive layer is a continuous material layer;
    a second conductive layer disposed within the second volume; and
    a decreasing ion implantation density in the first conductive layer extending from the top portion having a greater ion density to the bottom portion having a lesser ion density.

11. The semiconductor structure of claim 10, wherein first volume has a depth to width ratio of about 5.

12. The semiconductor structure of claim 11, wherein a thickness of the first conductive layer is approximately 3 nm.

13. The semiconductor structure of claim 12, wherein the first conductive layer includes cobalt.

14. The semiconductor structure of claim 13, wherein the glue layer is titanium or titanium nitride.

15. The semiconductor structure of claim 14, wherein the first volume is about 100 nm deep.

16. The semiconductor structure of claim 15, wherein the greater ion density and the lesser ion density is associated with ions of fluoride ions.

17. The semiconductor structure of claim 15, wherein the greater ion density and the lesser ion density is associated with helium ions or nitrogen ions.

18. The semiconductor structure of claim 15, wherein between the top portion and the bottom portion of the first conductive layer has a decreasing ion implantation density gradient.

19. The semiconductor structure of claim 18, wherein the second conductive layer includes tungsten.

20. A semiconductor structure formed in a recess, comprising:
    a substrate comprising germanium and having a surface and a first volume defining sidewalls and a bottom;
    a glue layer comprising titanium disposed along the sidewalls and the bottom;

a first conductive layer comprising tungsten disposed on the glue layer and defining a second volume, wherein the first conductive layer is a continuous material layer; and a second conductive layer comprising cobalt filling the second volume;

wherein the first conductive layer includes ions of a first density near the surface and a second density near the bottom, the first density greater than the second density.

* * * * *